United States Patent
Garnett et al.

(10) Patent No.: US 7,164,587 B1
(45) Date of Patent: Jan. 16, 2007

(54) INTEGRAL HEATSINK GROUNDING ARRANGEMENT

(75) Inventors: Paul J. Garnett, Camberley (GB); Sean Conor Wrycraft, Harrow (GB)

(73) Assignee: Sun Microsystems, Inc., Santa Clara, CA (US)

( * ) Notice: Subject to any disclaimer, the term of this patent is extended or adjusted under 35 U.S.C. 154(b) by 52 days.

(21) Appl. No.: 10/757,735

(22) Filed: Jan. 14, 2004

(51) Int. Cl.
*H05K 9/00* (2006.01)
*H05K 7/12* (2006.01)
*H05K 7/20* (2006.01)

(52) U.S. Cl. ............ 361/799; 361/816; 361/800; 361/719; 361/704; 361/707; 361/712; 361/711; 174/350; 174/351; 174/362; 174/366

(58) Field of Classification Search ......... 361/800, 361/816, 818, 702–704, 707, 711, 714, 715, 361/709, 712, 719, 799, 721, 753; 174/35 R, 174/35 GC, 350, 351, 366–368, 362; 29/830, 29/840
See application file for complete search history.

(56) References Cited

U.S. PATENT DOCUMENTS

| | | | | |
|---|---|---|---|---|
| 4,203,179 | A * | 5/1980 | Braeger | 452/127 |
| 4,381,032 | A * | 4/1983 | Cutchaw | 165/46 |
| 4,938,207 | A * | 7/1990 | Vargo | 602/26 |
| 5,005,638 | A * | 4/1991 | Goth et al. | 165/80.4 |
| 5,166,772 | A | 11/1992 | Soldner et al. | |
| 5,357,404 | A | 10/1994 | Bright et al. | |
| 5,369,601 | A | 11/1994 | Tannenbaum | |
| 5,371,404 | A | 12/1994 | Juskey et al. | |
| 5,524,908 | A | 6/1996 | Reis | |
| 5,561,265 | A | 10/1996 | Livshits et al. | |
| 5,566,052 | A | 10/1996 | Hughes | |
| 5,586,005 | A | 12/1996 | Cipolla et al. | |
| 5,607,538 | A * | 3/1997 | Cooke | 156/291 |
| 5,639,989 | A | 6/1997 | Higgins, III | |
| 5,748,455 | A | 5/1998 | Phillips et al. | |
| 5,754,400 | A * | 5/1998 | Sathe et al. | 361/704 |
| 5,804,875 | A | 9/1998 | Remsburg et al. | |
| 5,825,634 | A | 10/1998 | Moorehead, Jr. | |
| 5,866,943 | A | 2/1999 | Mertol | |
| 5,875,096 | A * | 2/1999 | Gates | 361/704 |
| 5,880,524 | A | 3/1999 | Xie | |
| 5,880,930 | A * | 3/1999 | Wheaton | 361/690 |
| 5,932,925 | A | 8/1999 | McIntyre | |

(Continued)

OTHER PUBLICATIONS

"Identifying an EMI Source and Coupling Path in a Computer System with Sub-Module Testing"; Radu, et al.; Electromagnetic Compatibility Laboratory, Department of Electrical Engineering, University of Missouri-Rolla, Rolla, MO & Electromagnetic Compatibility Group, Sun Microsystems, Mountain View, CA; p. 165-170; Jun. 1997.

(Continued)

*Primary Examiner*—Elvin Enad
*Assistant Examiner*—Dameon E. Levi
(74) *Attorney, Agent, or Firm*—Meyertons Hood Kivlin Kowert & Goetzel, P.C.; B. Noël Kivlin (57) ABSTRACT

An electromagnetic (EM) shielding assembly shields an electronic component mounted on a circuit board. The assembly includes a shielding portion that is electrically conductive and can be mounted adjacent an electronic component that it is desired shield. The shielding portion at least partially surrounds the component, thereby providing a degree of EM shielding. The assembly also includes at least one resiliently biased electrically conductive connection member in electrical communication with the shielding portion. The connection member is operable electrically to connect the shielding portion to a predetermined voltage by bearing down upon an electrically conductive contact of the circuit board.

21 Claims, 10 Drawing Sheets

U.S. PATENT DOCUMENTS

| | | | |
|---|---|---|---|
| 6,037,659 A | 3/2000 | Weixel | |
| 6,057,600 A | 5/2000 | Kitazawa et al. | |
| 6,075,289 A | 6/2000 | Bistefano | |
| 6,084,178 A | 7/2000 | Cromwell | |
| 6,088,231 A | 7/2000 | Fajardo | |
| 6,137,051 A | 10/2000 | Bundza | |
| 6,140,577 A | 10/2000 | Rapaich et al. | |
| 6,198,630 B1 | 3/2001 | Cromwell | |
| 6,212,074 B1 * | 4/2001 | Gonsalves et al. | 361/717 |
| 6,219,239 B1 | 4/2001 | Mellberg et al. | |
| 6,239,359 B1 | 5/2001 | Lilienthal, II et al. | |
| 6,252,313 B1 | 6/2001 | Zhang et al. | |
| 6,259,609 B1 | 7/2001 | Kurz | |
| 6,269,863 B1 | 8/2001 | Wyler | |
| 6,278,615 B1 * | 8/2001 | Brezina et al. | 361/799 |
| 6,278,617 B1 | 8/2001 | Yang et al. | |
| 6,288,330 B1 | 9/2001 | Chen | |
| 6,288,344 B1 | 9/2001 | Youker et al. | |
| 6,317,328 B1 * | 11/2001 | Su | 361/704 |
| 6,320,268 B1 * | 11/2001 | Lang et al. | 257/785 |
| 6,324,074 B1 | 11/2001 | Lunden | |
| 6,331,937 B1 * | 12/2001 | Bartyzel | 361/687 |
| 6,362,477 B1 | 3/2002 | Sowerby et al. | |
| 6,362,977 B1 | 3/2002 | Tucker et al. | |
| 6,377,474 B1 * | 4/2002 | Archambeault et al. | 361/818 |
| 6,400,577 B1 | 6/2002 | Goodwin et al. | |
| 6,404,632 B1 * | 6/2002 | Forkas | 361/703 |
| 6,444,900 B1 | 9/2002 | Casey | |
| 6,452,113 B1 | 9/2002 | Dibene, II et al. | |
| 6,501,658 B1 * | 12/2002 | Pearson et al. | 361/709 |
| 6,515,861 B1 | 2/2003 | Andric et al. | |
| 6,524,120 B1 | 2/2003 | Zhao | |
| 6,543,521 B1 | 4/2003 | Sato et al. | |
| 6,573,590 B1 | 6/2003 | Radu et al. | |
| 6,577,504 B1 | 6/2003 | Lofland et al. | |
| 6,606,246 B1 | 8/2003 | Wells | |
| 6,611,431 B1 * | 8/2003 | Lee et al. | 361/719 |
| 6,643,137 B1 * | 11/2003 | Chung et al. | 361/719 |
| 6,654,256 B1 | 11/2003 | Gough | |
| 6,679,712 B1 * | 1/2004 | Chang | 439/248 |
| 6,683,796 B1 | 1/2004 | Radu et al. | |
| 6,775,140 B1 | 8/2004 | Shim et al. | |
| 6,819,553 B1 | 11/2004 | Willis et al. | |
| 6,819,566 B1 * | 11/2004 | Danovitch et al. | 361/704 |
| 6,819,572 B1 | 11/2004 | Schaffer | |
| 6,856,796 B1 * | 2/2005 | Ding et al. | 455/295 |
| 6,867,976 B1 * | 3/2005 | Belady et al. | 361/704 |
| 6,939,742 B1 * | 9/2005 | Bhatia et al. | 438/117 |
| 2002/0166681 A1 | 11/2002 | Muzurkiewicz | |
| 2003/0007334 A1 | 1/2003 | Farassat | |
| 2003/0111738 A1 | 6/2003 | Buschbom | |
| 2003/0227759 A1 | 12/2003 | Haworth | |
| 2004/0012939 A1 | 1/2004 | Ta et al. | |
| 2004/0179344 A1 | 9/2004 | Uchida | |

OTHER PUBLICATIONS

"Radio Frequency Interference Seal"; IBM Technical Disclosure Bulletin, vol. 33, No. 5, IBM Corp., Armonk, NY, Oct. 1990.

"Mechanical Enabling Efforts"; Intel Developer Forum, Sep. 2000.

"Intel Pentium 4 Processor in the 423-pin package EMI Guideline"; Oct. 2000.

U.S. Appl. No. 10/097,946, filed Mar. 14, 2002.

Otthello Heatsink, Sun Part No. 340-6655-07, Copyright 2001.

EMI fence for Othello heatsink, Sun Part No. 340-7201-03, Copyright 2001 (1 page).

Sputnik CPU board heatsink, Sun Part No. 340-7334-01, Copyright 2001 (3 pages).

* cited by examiner

INTEGRAL HEATSINK GROUNDING ARRANGEMENT

BACKGROUND OF THE INVENTION

The present invention relates to electromagnetic shielding for electronic components. In particular, the invention relates to electromagnetic shielding for electronic components that are mounted on circuit boards.

Electromagnetic (EM) emissions from electronic components such as microprocessors are problematic since they can lead to EM interference in neighbouring components, circuitry and/or systems. This problem is particularly pronounced where multiple electronic components are located in close proximity, whereby a relatively large amount of EM emissions are produced in a small space. An example of such a system would be a circuit board upon which a number of microprocessors are mounted.

In some systems an electronic component is provided with an electrically conductive shield. It is known to electrically ground such shields so that they may provide improved EM shielding. In some systems, an electrically conductive heatsink is provided which can also provide a degree of EM shielding and which can also be electrically grounded.

The provision of grounding for an EM shield and/or heatsink is problematic however, since it involves electrical connections, which can take up considerable space. In circuit board design, space is at a premium.

Some known methods of grounding an electrically conductive shield and/or heatsink and are unsatisfactory since they involve overly complex mechanical constructions.

Some known methods of grounding an electrically conductive shield and/or heatsink and are also unsatisfactory because they involve semi-permanent attachment to a circuit board and make it difficult to install/remove.

Accordingly, an aim of the present invention is to provide effective EM screening for an electronic component while avoiding the problems described above.

SUMMARY OF THE INVENTION

An aspect of the invention can provide an electromagnetic (EM) shielding assembly for shielding an electronic component mounted on a circuit board. The assembly can include an electrically conductive shielding portion mountable adjacent the electronic component at least partially to surround the electronic component. The assembly can also include at least one resiliently biased electrically conductive connection member in electrical communication with the shielding portion. The resiliently biased electrically conductive connection member can be operable electrically to connect the shielding portion to a predetermined voltage by bearing down upon an electrically conductive contact of the circuit board.

EM shielding can thereby be provided for the electronic component. The shielding provided by the shielding assembly can be enhanced by the connection to a predetermined voltage. The connection member can provide a robust electrical connection by bearing down upon the contact on the circuit board, but also allows for swift detachment of the shielding portion since the electrical connection need not involve any kind of fixing or attachment to the circuit board.

One or more of the at least one connection members can be receivable in one or more respective cavities in the shielding portion which are defined by a surface of the shielding portion to save space. The shielding portion can have a number of cooling members, some of which can accommodate a respective one of the cavities. The cooling members that accommodate the cavities can be arranged around a periphery of electronic component to allow the connection members to form a shielding cage around the component and to allow convenient positioning of the connecting members with respect to the contact or contacts on the circuit board. One or more support members can be provided to provide support (such as lateral support) for some or all of the connecting members. To provide an improved electrical contact between the connecting members and to improve the shielding provided for the electronic component, the support member(s) can be electrically conductive.

Another aspect of the invention can provide an apparatus including a circuit board, an electronic component mounted on the circuit board, and an electromagnetic (EM) shielding assembly as described above.

A number of types for electrical contacts on the circuit board can be employed. The electrical contact can include an electrically conductive surface layer. The electrical contact can include an opening in the circuit board in which the connection member is received, an interior surface of the opening being coated with an electrically conductive layer. Where a plurality of connecting members are provided, each member may bear down on a single electrical contact. Alternatively, each connection member may bear down on a respective contact.

A further aspect of the invention can provide a method for providing electromagnetic (EM) shielding for an electronic component mounted on a circuit board, which circuit board includes an electrically conductive contact for providing a connection to a predetermined voltage. The method can include providing an EM shielding assembly that includes an electrically conductive shielding portion and at least one resiliently biased electrically conductive connection member in electrical communication with the shielding portion. The method can also include mounting the shielding portion adjacent the electronic component such that the shielding portion at least partially surrounds the component and such that the connection member electrically connects the shielding portion to the predetermined voltage by bearing down upon the electrically conductive contact.

BRIEF DESCRIPTION OF THE DRAWINGS

Embodiments of the present invention will be described hereinafter, by way of example only, with reference to the accompanying drawings in which like reference signs relate to like elements and in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims. In this regard, combinations of features from the independent claims with features of dependent claims other than as presented by the dependencies of the claims, and also with features from the description, are envisaged.

DESCRIPTION OF PARTICULAR EMBODIMENTS

Figure 1:
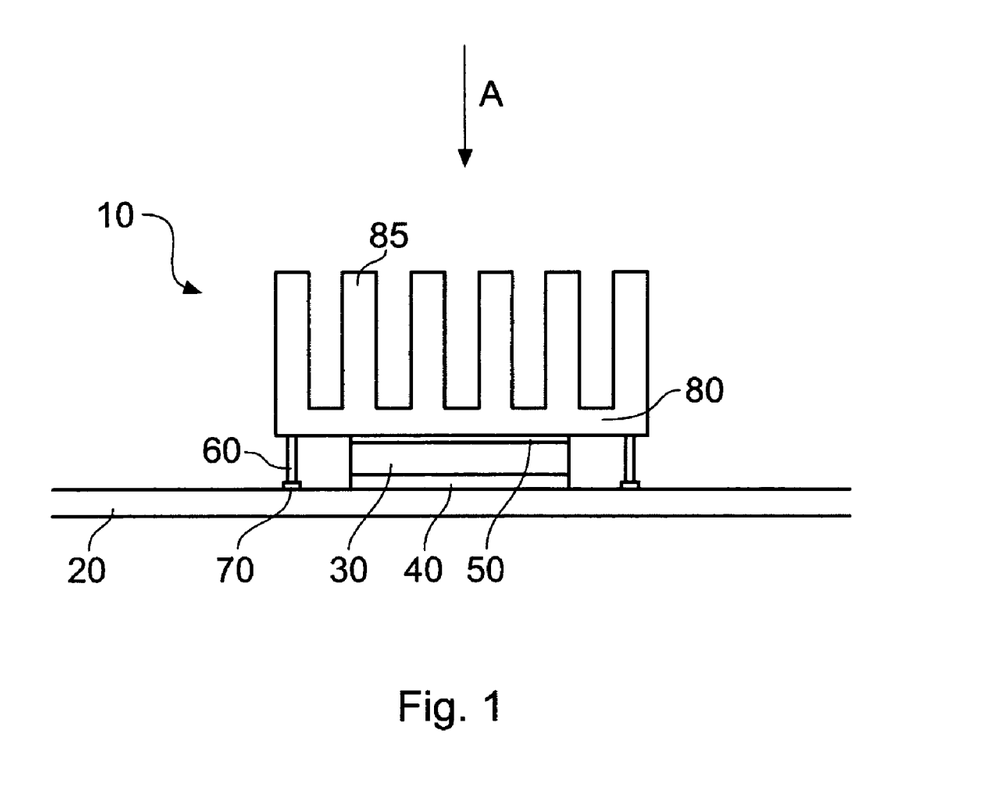
FIG. 1 shows an example of an EM shielding assembly and a circuit board with an electronic component mounted thereon.

FIG. 1 shows an example of an EM shielding assembly 10 and a circuit board 20 with an electronic component 30 mounted thereon.

The circuit board 20 may be a printed circuit board. The electronic component 30 may, for example, be a microprocessor. In this example the electronic component 30 is mounted in a socket 40, which is itself mounted on the circuit board 20. In other examples, the electronic component 30 may be mounted directly on the circuit board 20.

The EM shielding assembly 10 includes an electrically conductive shielding portion 80, which is mounted adjacent the electronic component 30. The EM shielding assembly 10 can have a number of cooling members 85 (as shown by way of example in FIG. 1) and in such cases can, as well as providing a degree of EM shielding for the electronic component 30, also act as a heat sink and provide cooling for the electronic component 30. In this example, a thermally conductive medium 50 such as a thermal grease is provided between the electrically conductive shielding portion 80 and the electronic component 30 to ensure a good thermal contact therebetween. Alternatively, the electrically conductive shielding portion 80 may be in direct contact with the electronic component 30.

The shielding portion 80 can be constructed from a solid electrically conductive material such as a metal. Alternatively, the shielding portion 80 may be formed from an electrically non-conductive material, which is coated with an electrically conductive material. Materials which are both electrically and thermally conductive may be chosen.

The EM shielding assembly 10 also includes a number of electrically conductive connection members 60. While in some examples, only a single connection member 60 may be provided, in this example there are a plurality of connection members 60. In FIG. 1, some of the connection members are not shown, so as more clearly to display the arrangement of the electronic component 30, the socket 40 and the thermally conductive medium 50. Each connection member 60 is in electrical communication with the electrically conductive shielding portion 80. Each connection member 60 is resiliently biased away from the shielding portion 80 and, when the shielding portion is in place, bears down upon a respective electrical connection 70, which is located on the circuit board 20. Each electrical connection 70 can be held at a predetermined voltage such as a ground voltage or at a voltage corresponding to logical ground of the electronic component 30. By bearing down upon the electrical connections 70, the connection members 60 provide a robust electrical connection for the electrically conductive shielding portion 80 to the predetermined voltage. Connecting the electrically conductive shielding portion 80 to the predetermined voltage allows the electrically conductive shielding portion 80 to provide more effective EM shielding for the electronic component 30.

The use of resiliently biased connection members 60 in conjunction with the electrical connections 70 allows the electrically conductive shielding portion 80 to be connected to a predetermined voltage without actual physical attachment of the shielding portion 80 to the circuit board 20. Physical attachment of the shielding portion 80 to the circuit board 20 and/or the electronic component 30 may thereby be provided independently of the provision of electrical connections for the shielding portion 80 to a predetermined voltage, which allows more freedom in choosing a particular physical attachment method. The shielding portion 80 may be mounted directly onto the electronic component 30 (for example by gluing). Alternatively, the shielding portion 80 may be attached to the circuit board 20 and held in place over the component 30. Methods of directly attaching the shielding portion 80 to the circuit board 20 include the use of one or more mounting struts (not shown), which extend from the shielding portion 80 and attach to the circuit board 20 by way of, for example, screw attachments or the use of a conventional clamping arrangement (not shown).

Figure 2:
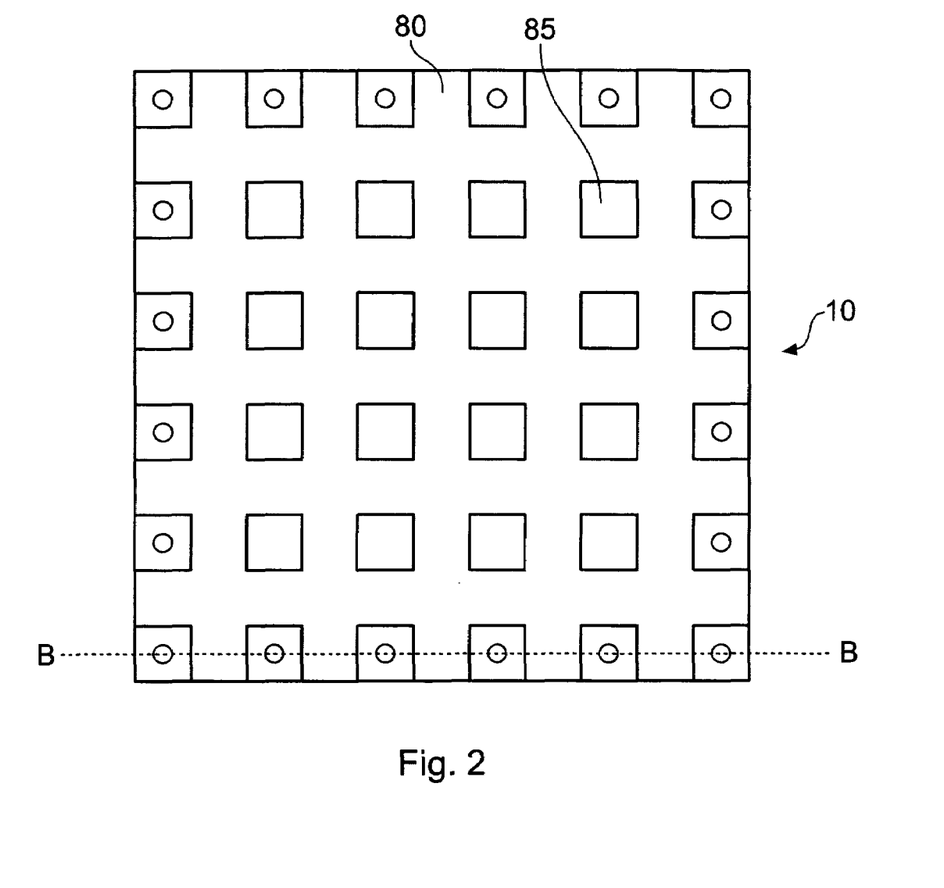
FIG. 2 shows a view of the shielding portion shown in FIG. 1, the view is along the direction shown by arrow 'A' in FIG. 1.

FIG. 2 shows a view of the shielding portion 80 along the direction of arrow 'A' in FIG. 1. As can be seen in FIG. 2, the cooling members 85 in this example are arranged in a square array. FIG. 2 also shows the arrangement of the connection members 60 with respect to the cooling members 85. In this example, a connection member 60 is provided adjacent each cooling member 85 in the outer ring of cooling members provided on the shielding portion 80 (these are represented by the circles in FIG. 2). With reference to FIGS. 1 and 2 it can be seen that the relative dimensions of the shielding portion 80 with respect to the electronic component 30, and the arrangement of the cooling members 85 in this example are such that the connection members 60 extend past the peripheral edge of electronic component 30 and toward the electrical connections 70 provided on the circuit board. Where no cooling members 85 are provided, the connection members 60 may nevertheless be similarly distributed around the periphery of the shielding portion 80.

Figure 3A:
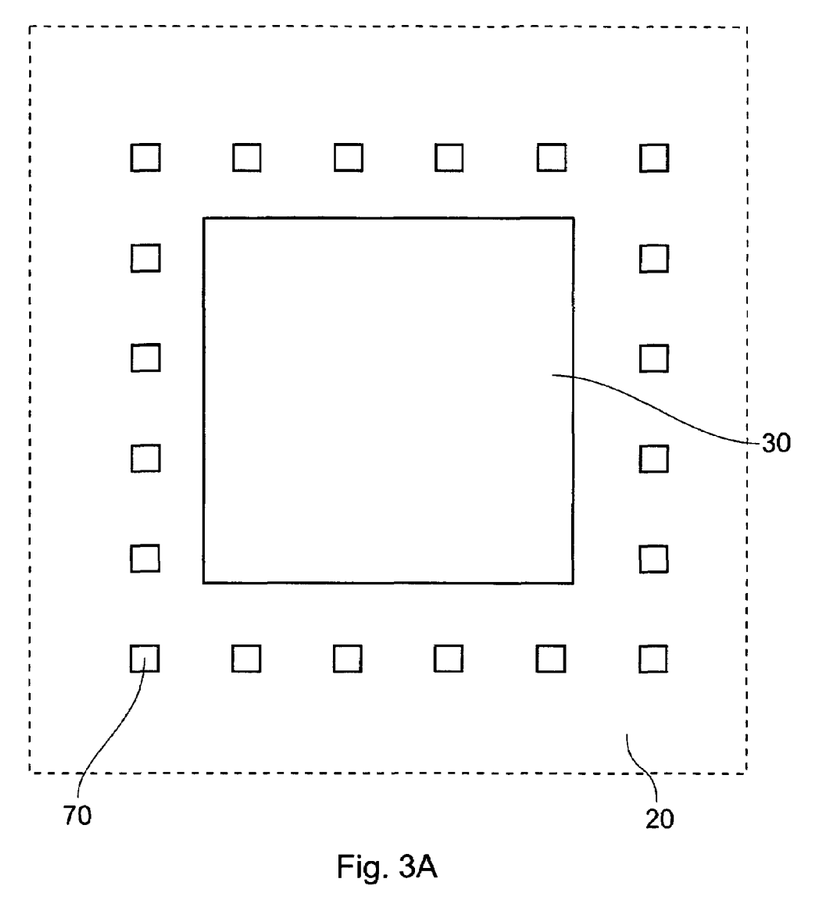
FIG. 3A shows an example of a circuit board and electronic component such as shown in FIG. 1, with the shielding assembly removed; the view is along the direction shown by arrow 'A' in FIG. 1.
Figure 3B:
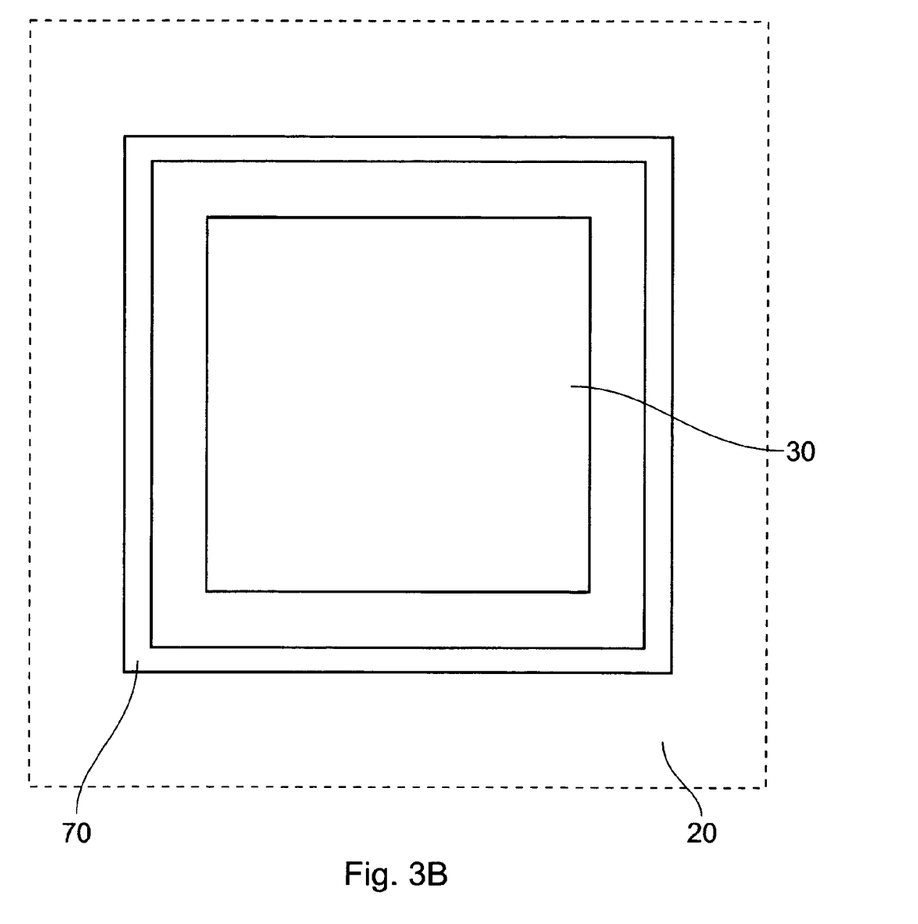
FIG. 3B shows another example of a circuit board and electronic component such as shown in FIG. 1, with the shielding assembly removed; the view is along the direction shown by arrow 'A' in FIG. 1.

FIGS. 3A and 3B show two example arrangements for the electrical connection/s 70 on the circuit board 20, shown from the direction of arrow 'A' in FIG. 1. The shielding member 80 is omitted in FIGS. 3A and 3B so as not obscure the arrangement of the connection/s 70. While in FIGS. 3A and 3B, the circuit board 20 is shown schematically by a dashed line, it will be appreciated that the circuit board may extend further than is actually shown.

In the example shown in FIG. 3A, a plurality of separate connections 70 are provided. The connections 70 are arranged around the periphery of the electronic component 30. Each connection corresponds to a respective connection member 60 on the shielding portion 80.

In the example shown in FIG. 3B, a single connection 70 is provided. The connection 70 is arranged perimetrically around the electronic component 30 and is arranged to receive all of the connection members 60 of the shielding portion 80.

Other arrangements for the connection/s 70 are envisaged. In some examples, each connection 70 may provide a connection for more than one connection member, there being more than one connection 70 provided overall.

A number of examples of connection members 60 and their arrangements with respect to the shielding portion 80 will now be described with reference to FIGS. 4 to 6. Each of FIGS. 4 to 6 is a cross sectional view of the various components included in the system (circuit board 20, connection member 60, shielding portion 80 etc) taken along the line B—B in FIG. 2.

Figure 4:
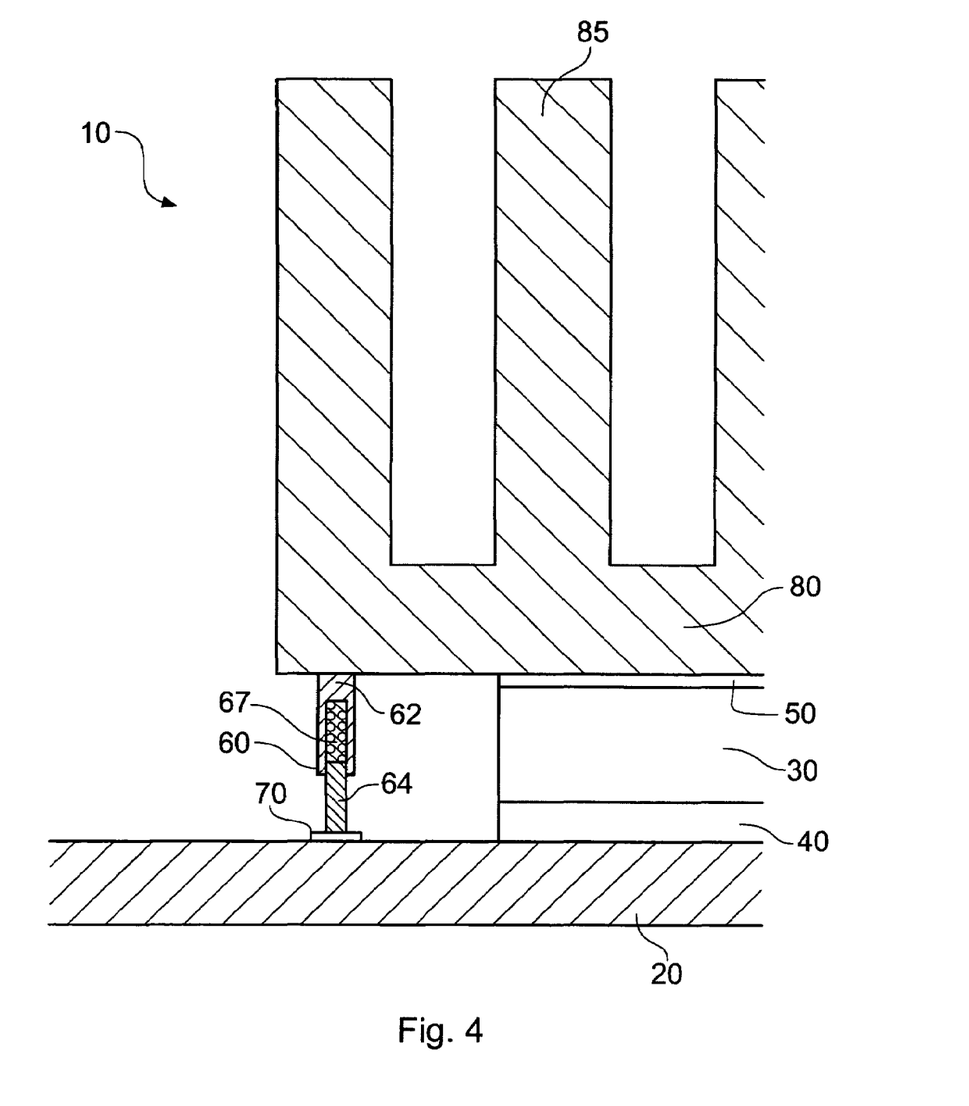
FIG. 4 shows a cross sectional view of an example of a shielding assembly such as shown in FIG. 2; the cross section is taken along the line B—B in FIG. 2.

FIG. 4 shows a first example of a resiliently biased connection member 60. The connection member 60 is elongate and extends away from the shielding portion 80. In this example, the connection member 60 has an upper portion 62 and a lower portion 64. The upper portion 62 may be integrally formed with or attached to the shielding portion 80. The lower portion 64 is slideably received within the upper portion 62. The lower portion 64 is resiliently biased against insertion of the lower portion 64 into the upper portion 62 however, and when the shielding portion 80 is in place, the lower portion 64 bears down upon the connection 70 on the circuit board 20. An electrical connection for the shielding portion 80 to a predetermined voltage is thereby formed. The resilient biasing of the lower portion 64 is provided by an internal biasing element such as a spring 67.

Figure 5:
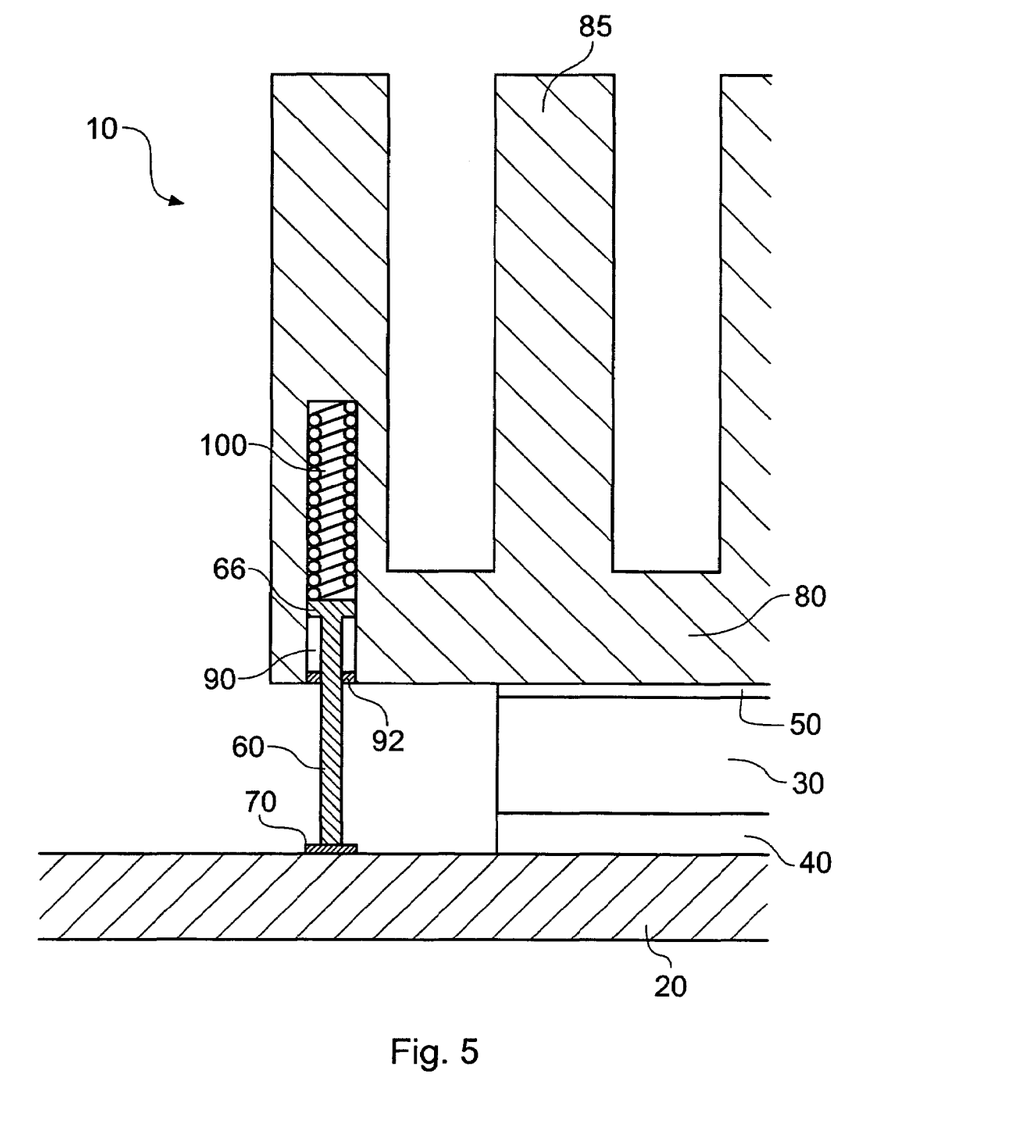
FIG. 5 shows a cross sectional view of another example of a shielding assembly such as shown in FIG. 2; the cross section is taken along the line B—B in FIG. 2.
Figure 6:
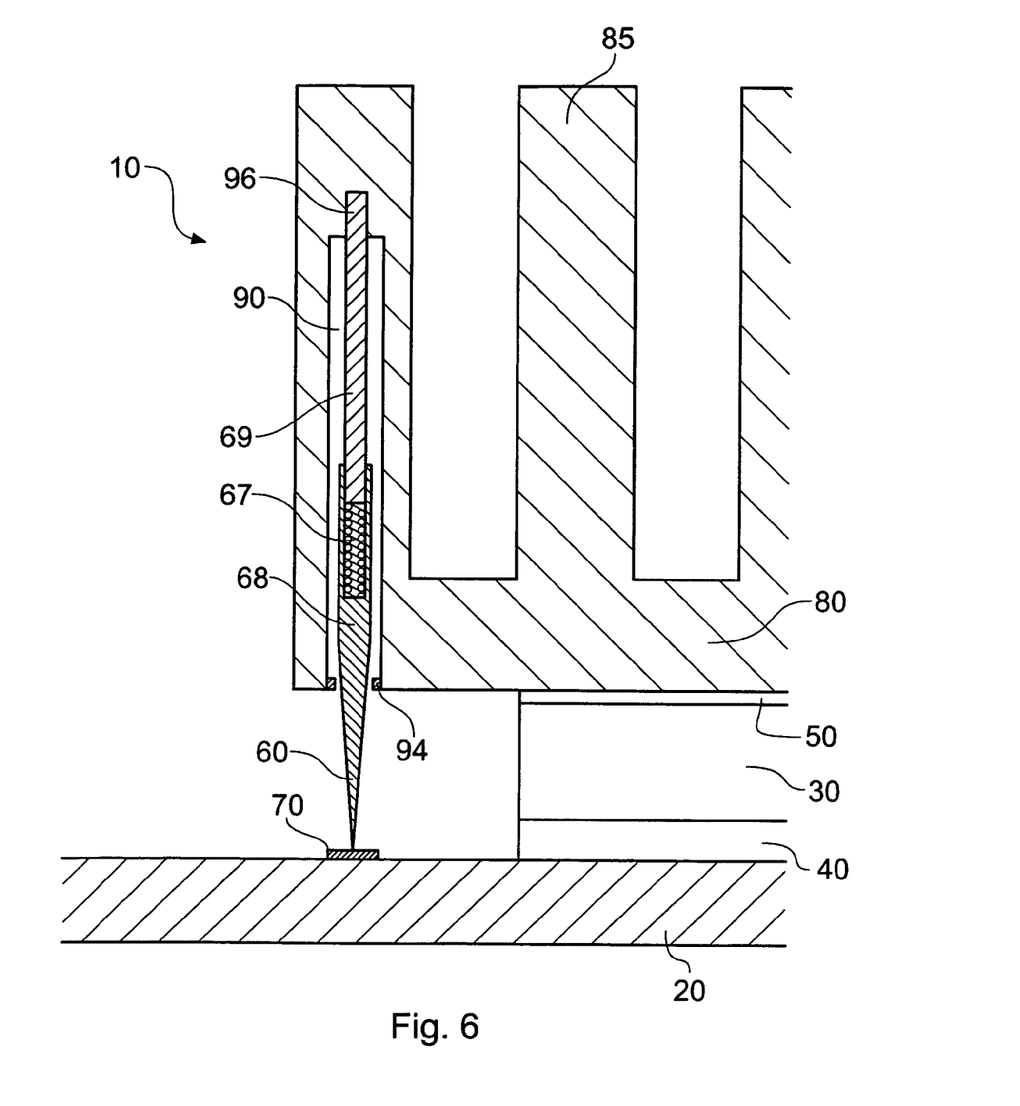
FIG. 6 shows a cross sectional view of a further example of a shielding assembly such as shown in FIG. 2; the cross section is taken along the line B—B in FIG. 2.

FIG. 5 shows another example of a connection member 60. The connection member in this example is elongate and is partially received within a cavity 90 in the shielding portion 80. The cavity 90 can be at least partially enclosed by a cooling member 85 of the shielding portion 80.

The provision of a connection member 60, receivable within a cavity 90 in the shielding portion 80, constitutes a compact and robust construction.

Also present in the cavity 90 is a biasing element such as a spring 100. The biasing element is operable to oppose further insertion of the connection member 60 into the cavity 90. When the shielding portion 80 is in place, the connection member thus bears down upon the connection 70 on the circuit board 20.

A retainer 92 may be provided to prevent removal of the connection member 60 from the cavity 90. In this example, the retainer 92 comprises an annular plug that is operable to engage a flange 66 on the connection member 60. During construction, the plug may be inserted into the cavity 90 after insertion of the biasing element (e.g. the spring 100) and the connection member 60.

The connection member 60 can be formed as an integral unit with the biasing element 100 and a retainer 92, the integral unit being receivable as an interference fit within the cavity 90.

A further example of a connection member 60 is shown in FIG. 6. The connection member 60 in this example is also elongate and is at least partially received within a cavity 90 in the shielding portion 80. The connection member 60 has a lower portion 68 and an upper portion 69. The upper portion 69 can be attached to the shielding portion 80 with an interference fit 96. Alternatively, or as well as the interference fit 96, a plug 94 may be provided to prevent removal of the connection member 60 from the cavity 90. The upper portion 69 is received within the lower portion 68 but is resiliently biased to oppose further insertion therein.

The resilient biasing of the upper portion 64 is provided by an internal biasing element such as a spring 67.

The lower portion 68 extends out of the cavity 90 and away from the shielding portion 80. As will be described below, the configuration of the end of the connection member that bears down upon the connection 70 may take a number of different forms. In this example, the end of the lower portion 68 distal the upper portion 69 has a pointed tip.

In all of the examples described above in which the connection member 60 has an upper/lower portion which is receivable within a lower/upper portion, it is envisaged that the configuration of the upper and lower portions may be reversed in accordance with construction or other requirements. For instance, in the example described in relation to FIG. 6, the lower portion 68 may be receivable within the upper portion 69.

Construction materials for the connection members include electrically conductive materials such as metals.

The connection members may take the form of contact probes such as those commercially available from Interconnect Devices Inc., and described at http://www.idinet.com.

Figure 7:
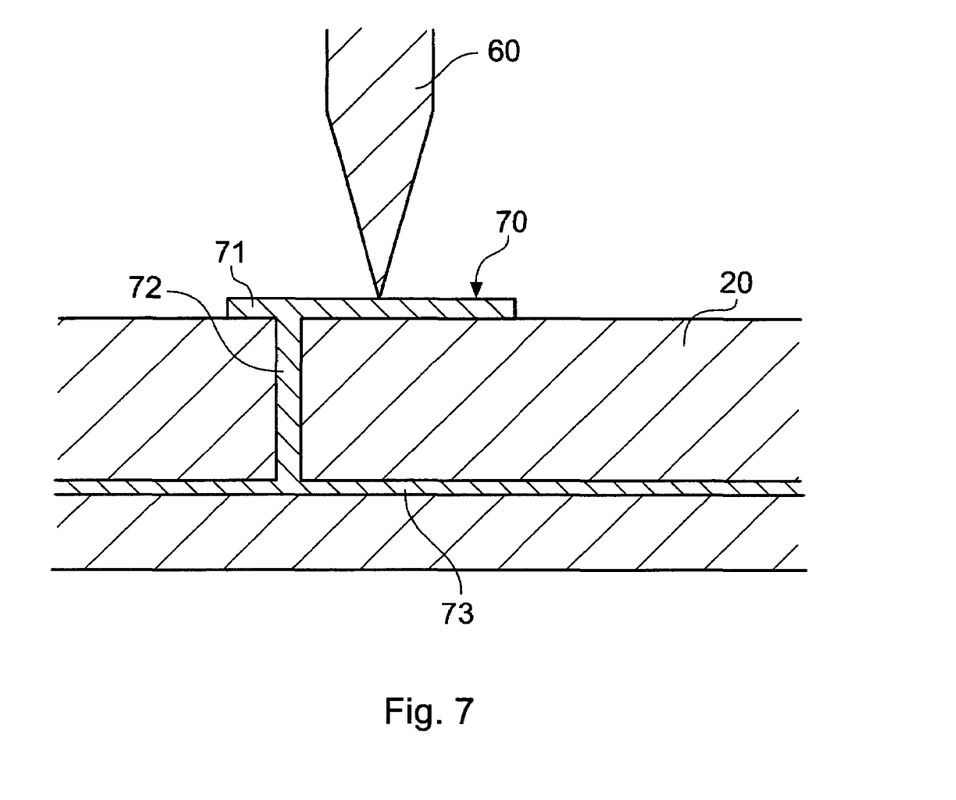
FIG. 7 shows a cross sectional view of an example of an electrical contact and connection member.
Figure 8:
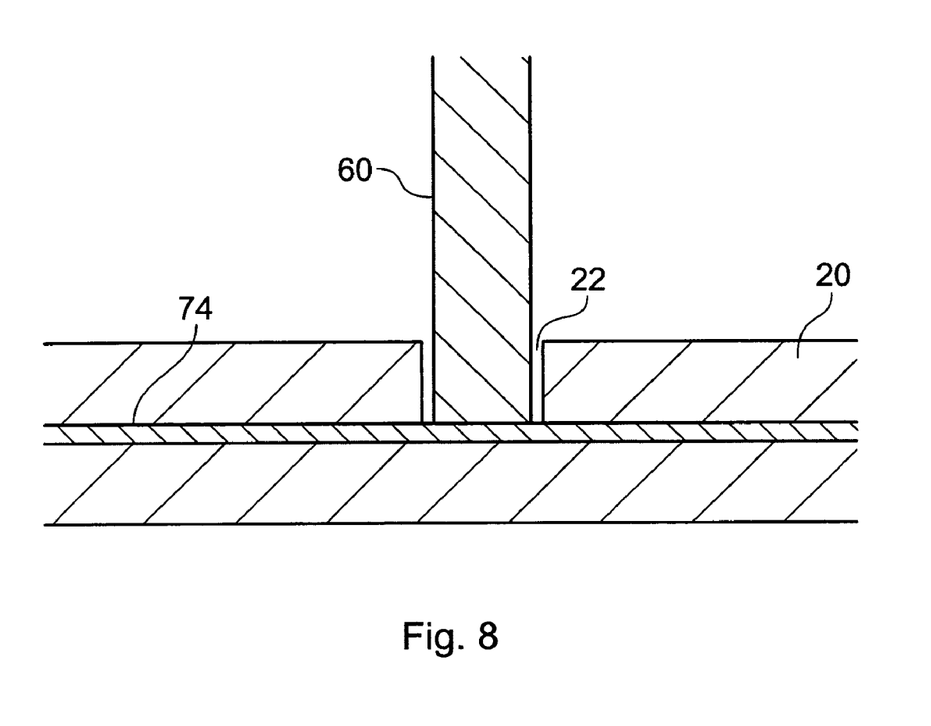
FIG. 8 shows a cross sectional view of another example of an electrical contact and connecting member.

Examples of connections 70 on a circuit board 20 are now described in relation to FIGS. 7 and 8. These Figures show the circuit board 20, connection 70 and connection member 60 in cross section, for example along the line B—B shown in the example in FIG. 2.

In the example shown in FIG. 7, the connection 70 includes a surface layer 71, which is electrically connected through a via 72 to a conductive plane 73. The plane 73 is held at a predetermined voltage (whereby the surface layer is also held at that voltage). The plane 73 may be a ground plane, whereby the plane is held at ground voltage. The ground voltage may, for example, be logic ground for a microprocessor that constitutes the electronic component 30 to be shielded. The connection member 60 bears down upon the surface layer 71 and thereby forms a connection for the shielding portion 80 to the predetermined voltage.

In the example shown in FIG. 8, the connection 70 includes an opening 22 in the surface of the circuit board 20. The opening 22 has an interior surface that is at least partially coated with a conductive material. For example, in FIG. 8 the opening terminates at a conductive plane 74, which extends through the circuit board 20. The plane 74 is held at a predetermined voltage, as described in relation to the plane 73 in the example shown in FIG. 7. The opening 22 is suitably dimensioned to receive the tip of a connection member 60. The connection member 60 bears down upon the section of the plane 74 which is exposed by the opening 22 and thereby forms a connection for the shielding portion 80 to the predetermined voltage.

While in the examples shown in FIGS. 7 and 8, a 'pointed' and a 'flat-ended' connection member 60 are provided respectively, it is envisaged that either type may be employed with respect to the types of connection 70 described here. Connection members 60 having pointed tips allow the tip to dig into the connection 70 (e.g. into the surface plane 71 or the conductive plane 74 thereof). This may provide a connection that is physically more stable than that provided by a flat-ended connection member. On the other hand, a flat-ended connection member may allow an electrical connection with a greater surface area between the tip and the connection 70, thereby providing a less resistive connection.

In the examples described here, the materials used for the conductive planes, surface planes and so forth of the connection 70 include conductive metals (or metallic alloys) such a gold or copper.

Both of the connection types described in relation to FIGS. 7 and 8 are suitable for providing either the discrete or track-like connections 70 described in relation to FIGS. 3A and 3B. Thus, the connections 70 shown in FIG. 3A may each comprise a surface layer (as described in relation to FIG. 7) or an opening (as described in relation to FIG. 8). Similarly, the track-like connection 70 shown in FIG. 3A may include a surface layer arranged perimetrically around the electronic component 30, or may include an extended opening arranged around the component 30, exposing a loop-shaped area of a conductive plane in the circuit board.

Figure 9:
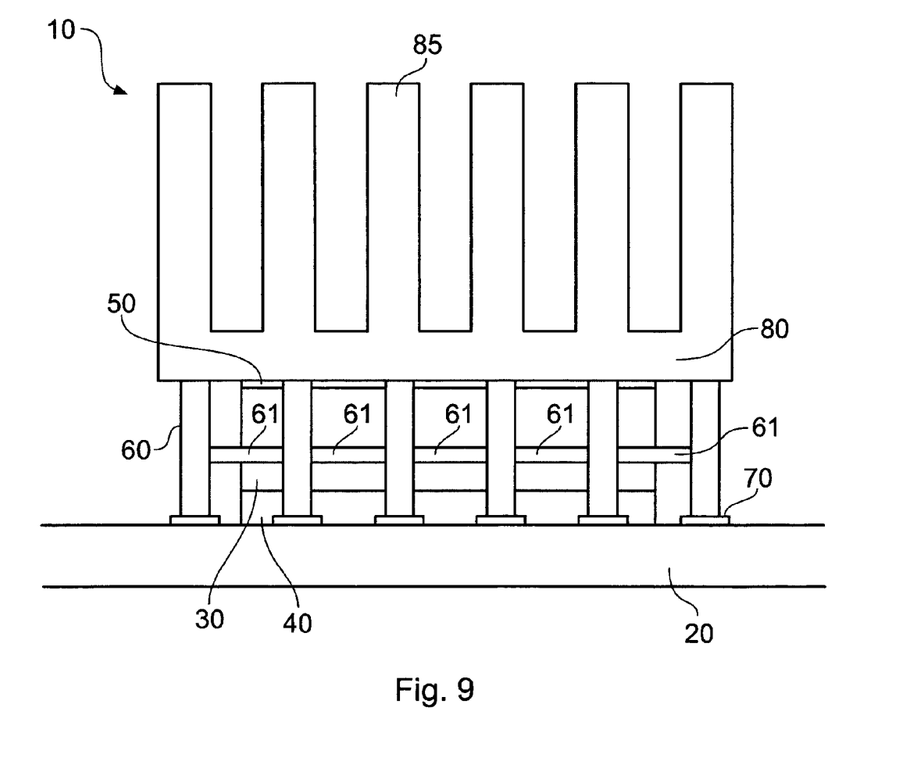
FIG. 9 shows another example of an EM shielding assembly and a circuit board with an electronic component mounted thereon.

FIG. 9 shows another example of a shielding assembly 10. In this example, a plurality of resiliently biased connection members 60 are provided. Each connection member 60 bears down upon a respective connection 70. A track-like connection may also be used in conjunction with this example.

The connection members 60 in this example are provided with a number of support members 61. In this example, each support member 61 extends laterally between neighboring pairs of connection members 60. The support members 61 provide lateral support for the connection members 60 and can prevent misalignment of the connection members 60, in particular with respect to the connection 70 on the circuit board 20. This can facilitate correct mounting of the shielding portion 80 with respect to the connection/s 70 and can prevent the connection members 60 from 'wandering' away from the connection/s 70 once the shielding portion 80 is mounted.

Additionally, the support members 61 can be electrically conductive, thereby improving electrical coherence between the connection members and improving the electrical connection for the shielding portion 80.

In cases where a plurality of connection members are provided, the connection members further serve to form an EM shielding cage around the periphery of the electronic component (this is evident, for example, in FIG. 9). The support members 61 can improve the ability of the cage to provide EM shielding.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An assembly, comprising:
   a circuit board including an electrically conductive contact coupled to the circuit board;
   an electronic component coupled to the circuit board;
   an electrically conductive shielding portion in thermal contact with the electronic component;
   a biasing element coupled to the electrically conductive shielding portion;
   a first electrically conductive connection member in contact with the biasing element and in electrical communication with the electrically conductive shielding portion; and
   wherein the biasing element resiliently biases the first electrically conductive connection member onto the electrically conductive contact forming a solder-less detachable electrical connection between the first electrically conductive connection member and the electrically conductive contact.

2. The assembly of claim 1, wherein a surface of the shielding portion defines a cavity for receiving at least one electrically conductive connection member; wherein the at least one electrically conductive connection member includes the first electrically conductive connection member.

3. The assembly of claim 2, the shielding portion having a plurality of cooling members extending away therefrom, wherein at least one cooling member accommodates the cavity.

4. The assembly of claim 1, further comprising a mounting strut for mounting the shielding portion on the circuit board.

5. The assembly of claim 1 comprising a plurality of electrically conductive connection members arranged to extend along a peripheral edge of the electronic component to form a shielding cage around the electronic component; wherein the plurality of electrically conductive connection members includes the first electrically conductive connection member.

6. The assembly of claim 5 further comprising one or more support members, each support member being attached to at least two electrically conductive connection members of the plurality of electrically conductive connection members.

7. The assembly of claim 6, wherein the one or more support members are electrically conductive.

8. The assembly of claim 1, wherein at least one of the electrically conductive shielding portion and the first electrically conductive connection member are metal.

9. The assembly of claim 1, wherein the biasing element is a spring.

10. The assembly of claim 1, wherein the biasing element comprises at least two parts.

11. An electromagnetic (EM) shielding assembly for shielding an electronic component mounted on a circuit board, the assembly comprising:
    an electrically conductive shielding portion mountable in thermal contact with the electronic component;
    a biasing element coupled to the electrically conductive shielding portion;
    a first electrically conductive connection member in contact with the biasing element and in electrical communication with the electrically conductive shielding portion;
    wherein the biasing element is configured to resiliently bias the first electrically conductive connection member onto an electrically conductive contact on the circuit board to form a solder-less detachable electrical connection between the first electrically conductive connection member and the electrically conductive contact when the electrically conductive shielding portion is mounted in thermal contact with the electronic component.

12. The assembly of claim 11, further comprising an opening in the circuit board in which said first electrically conductive connection member is received, an interior surface of the opening being coated with an electrically conductive layer forming said electrically conductive contact.

13. The assembly of claim 11, comprising a plurality of electrically conductive connection members, each connection member bearing down upon the electrically conductive contact; wherein the plurality of electrically conductive connection members includes the first electrically conductive connection member.

14. The assembly of claim 11, the circuit board having a plurality of said electrically conductive contacts, the EM shielding assembly comprising a plurality of electrically conductive connection members, each electrically conductive connection member bearing down upon a respective one of the electrically conductive contacts;

wherein the plurality of electrically conductive connection members includes the first electrically conductive connection member.

15. The apparatus of claim 11, wherein the first electrically conductive connection member comprises at least two parts.

16. A method for providing electromagnetic (EM) shielding for an electronic component mounted on a circuit board, the circuit board comprising an electrically conductive contact for providing a connection to a predetermined voltage, the method comprising:
   providing an EM shielding assembly comprising an electrically conductive shielding portion and at least one resiliently biased electrically conductive connection member in electrical communication with the shielding portion;
   mounting the shielding portion on the electronic component such that the shielding portion at least partially surrounds the component; and
   resiliently biasing the at least one electrically conductive connection member onto the electrically conductive contact to form a solder-less detachable electrical connection between the at least one electrically conductive connection member and the electrically conductive contact.

17. The method of claim 16, wherein a surface of the shielding portion defines a cavity for receiving one of the at least one electrically conductive connection members.

18. The method of claim 16, the shielding portion having a plurality of cooling members extending away therefrom, wherein at least one cooling member accommodates the cavity.

19. An apparatus, comprising:
   a substrate, wherein the substrate comprises at least one electrically conductive contact;
   an integrated circuit coupled to the substrate;
   an electrically conductive shield mountable adjacent the integrated circuit;
   a biasing element coupled to the electrically conductive shield; and
   a connection member in contact with the biasing element, wherein the connection member is resiliently biased onto the electrically conductive contact by the biasing element and wherein the connection member forms a detachable electrical connection between the electrically conductive shield and the electrically conductive contact.

20. The apparatus of claim 19, wherein the biasing element is a spring, and wherein the biasing element compresses as the connection member is biased onto the electrically conductive contact.

21. An assembly, comprising:
   a circuit board including an electrically conductive contact coupled to the circuit board;
   a substrate coupled to the circuit board;
   an electronic component coupled to the substrate;
   an electrically conductive shielding portion in thermal contact with the electronic component;
   an electrically conductive connection member, comprising a first piece and a second piece with a biasing element between the first piece and the second piece, coupled to the electrically conductive shielding portion through the first piece; and
   wherein the biasing element resiliently biases the first piece and second piece apart to bias the second piece onto the electrically conductive contact to form a solder-less detachable electrical connection between the electrically conductive connection member and the electrically conductive contact.

* * * * *